US010274526B2

(12) United States Patent
Reitsma et al.

(10) Patent No.: US 10,274,526 B2
(45) Date of Patent: Apr. 30, 2019

(54) REMOTE SENSING USING SENSOR RESONATOR WITH SENSOR INDUCTOR COUPLED TO RESONATOR CAPACITOR OVER SHIELDED CABLE

(71) Applicant: TEXAS INSTRUMENTS INCORPORATED, Dallas, TX (US)

(72) Inventors: George Pieter Reitsma, Redwood City, CA (US); Dongtai Liu, Fremont, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/486,292

(22) Filed: Apr. 12, 2017

(65) Prior Publication Data
US 2017/0292981 A1 Oct. 12, 2017

Related U.S. Application Data

(60) Provisional application No. 62/321,731, filed on Apr. 12, 2016.

(51) Int. Cl.
*G01R 27/32* (2006.01)
*G01D 5/12* (2006.01)
*G01R 27/26* (2006.01)

(52) U.S. Cl.
CPC ............ *G01R 27/32* (2013.01); *G01D 5/12* (2013.01); *G01R 27/26* (2013.01); *G01R 27/2611* (2013.01)

(58) Field of Classification Search
CPC ........ G01R 27/00; G01R 27/02; G01R 27/26; G01R 27/2611; G01R 27/267;
(Continued)

(56) References Cited

U.S. PATENT DOCUMENTS 4,219,740 A * 8/1980 Little ................. G01R 27/2611
307/116
9,995,778 B1 * 6/2018 Fiori, Jr. ............ G01R 27/2605
(Continued)

FOREIGN PATENT DOCUMENTS

CN 101960701 A 1/2011
EP 1793207 A1 6/2007
(Continued)

OTHER PUBLICATIONS

Application Report, Capacitive Proximity Sensing Using FDC2x1y, Texas Instruments Incorporated, SNOA940—Oct. 2015, pp. 1-6.
(Continued)

*Primary Examiner* — Hoai-An D. Nguyen
(74) *Attorney, Agent, or Firm* — Andrew Viger; Charles A. Brill; Frank D. Cimino

(57) ABSTRACT

Remote inductive sensing uses a sensor resonator with a remote sense inductor coupled to a resonator capacitor through a shielded transmission line. The T-line includes a signal line and a shield return line: the sense inductor is connected at a T-line sensing end between the signal line and the shield return line, and the resonator capacitor is connected at a T-line terminal end to at least the signal line. An inductance-to-data converter (IDC) is connected at the T-line terminal end to the signal line and shield return line (set to a common mode voltage). In operation, the IDC drives oscillation signals over the signal line to the sensor resonator to sustain a resonance state, with the sense inductor projecting a magnetic sensing field, and converts changes in oscillation drive signals, representing changes in resonance state resulting from a sensed condition, into sensor data corresponding to the sensed condition.

10 Claims, 5 Drawing Sheets

(58) Field of Classification Search
CPC ........... G01R 27/32; G01N 2021/7789; G01N 2291/014; G01D 5/00; G01D 5/12
USPC .... 324/600, 629, 633, 636, 649, 654, 76.11, 324/76.39, 76.75
See application file for complete search history.

(56) References Cited

U.S. PATENT DOCUMENTS

| | | | |
|---|---|---|---|
| 2006/0181906 A1 | 8/2006 | Batarseh et al. | |
| 2014/0338442 A1* | 11/2014 | Birtcher | G01F 23/2961 73/290 V |
| 2015/0002245 A1* | 1/2015 | Saloio, Jr. | G01R 35/005 333/219 |
| 2015/0185294 A1 | 7/2015 | Reitsma | |
| 2016/0091342 A1 | 3/2016 | Liu et al. | |
| 2016/0187275 A1* | 6/2016 | Pickles | G01D 5/2405 324/655 |
| 2016/0223607 A1* | 8/2016 | Paclibon | G01R 27/28 |

FOREIGN PATENT DOCUMENTS

| | | |
|---|---|---|
| UA | 7264 U | 5/2005 |
| WO | 2012133569 A1 | 10/2012 |
| WO | 2015015150 A1 | 2/2015 |

OTHER PUBLICATIONS

PCT Search Report for Application No. PCT/US 2017/027280, dated Aug. 14, 2017.
EU Search Report for Application No. 17783088.2-1022/344367, dated Jan. 3, 2019.

\* cited by examiner

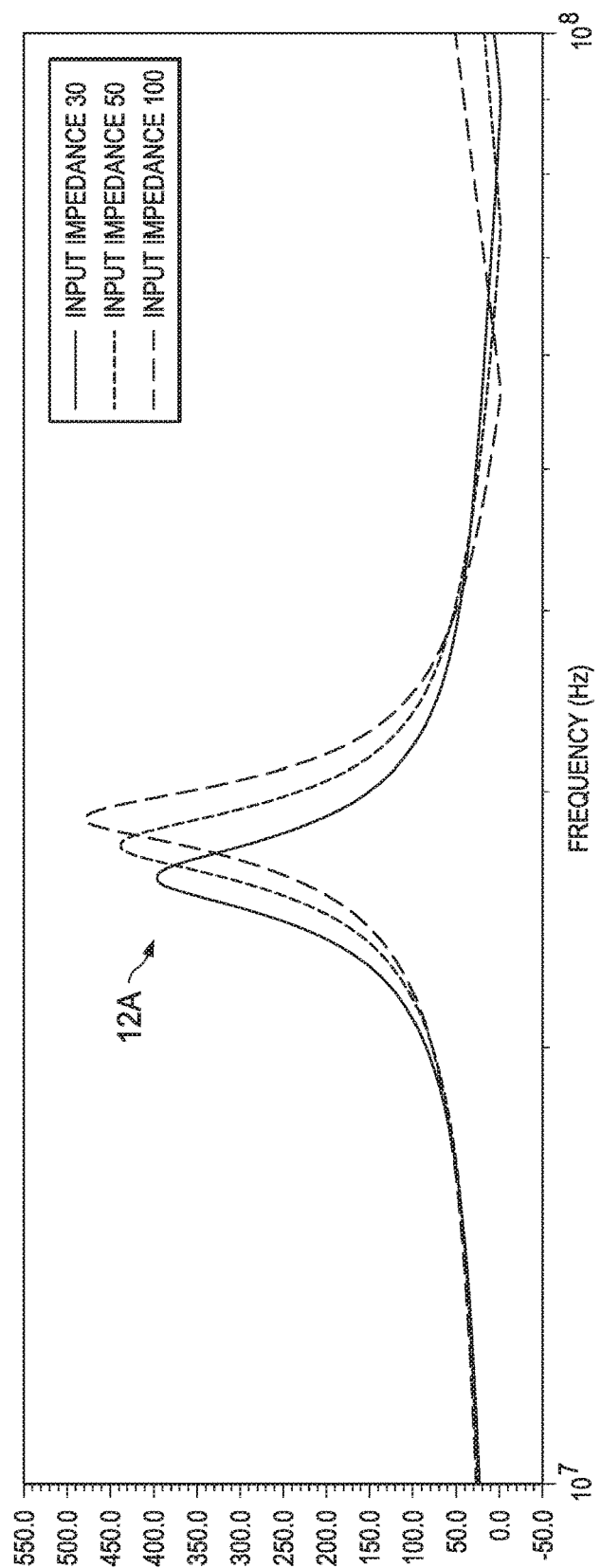

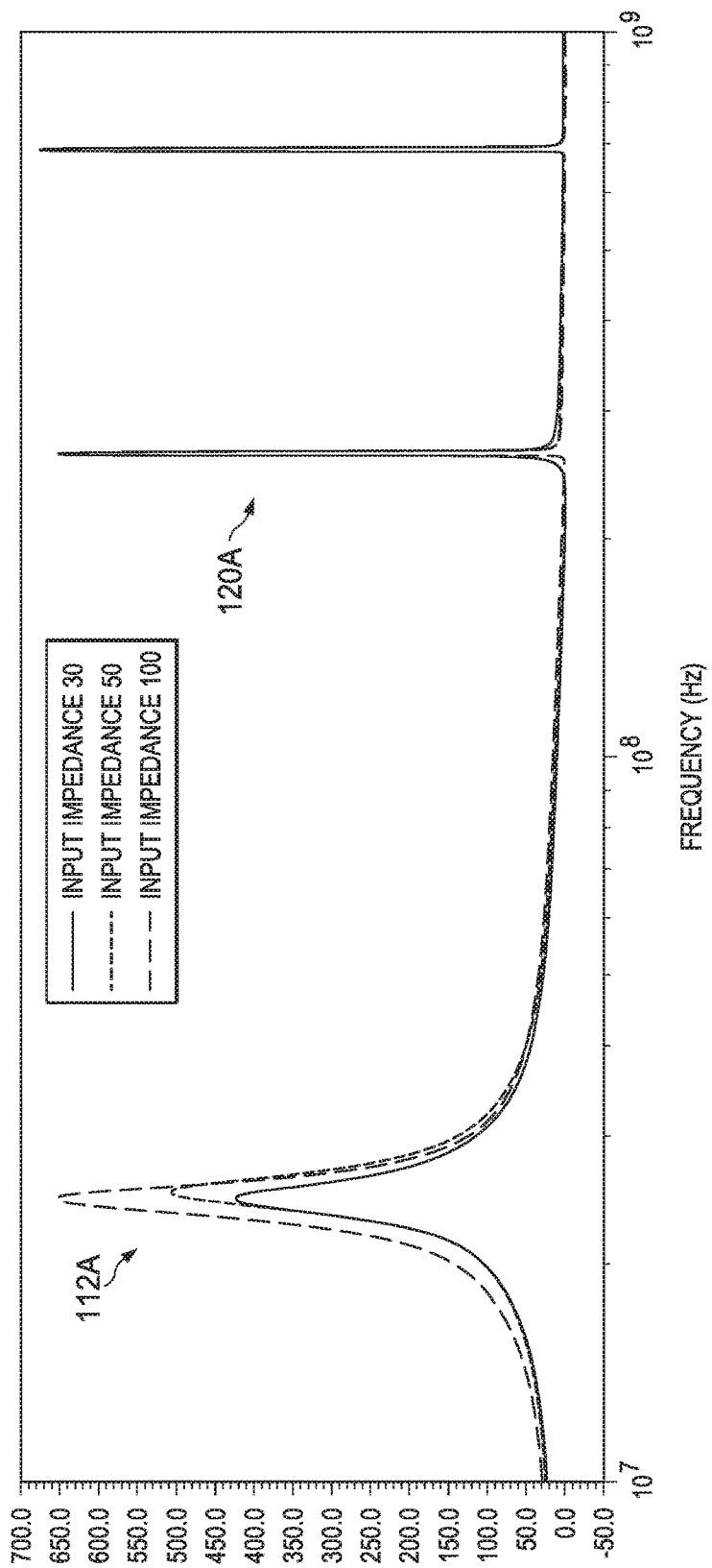

REMOTE SENSING USING SENSOR RESONATOR WITH SENSOR INDUCTOR COUPLED TO RESONATOR CAPACITOR OVER SHIELDED CABLE

CROSS-REFERENCE TO RELATED APPLICATIONS

Priority is claimed under 37 CFR 1.78 and 35 USC 119(e) to U.S. Provisional Application 62/321,731, filed 12 Apr. 2016), which is incorporated by reference.

BACKGROUND

Technical Field

This Patent Disclosure relates to inductive resonant sensing with a driven sensor resonator.

Related Art

Remote inductive sensing applications require an inductive sensor being located remote from the sensor electronics. In particular, for inductive sensing using a resonant sensor, the wire interconnect between a remote sensor LC resonator and sensor electronics is problematic because: (a) the wire interconnect introduces line inductance in series with the sensor inductor, and in parallel with the resonator capacitor, such that a second resonance mode is introduced; and (b) the wire interconnect can act as an antenna that emits and receives RF interference signals (EMI). For example, when an inductive resonant sensor is used inside an EMI environment like a cell phone, such as for touch button sensing, the inductive sensor operates in proximity to a strong RF transmitter.

FIG. 1A illustrates remote inductive resonant sensing with an inductive resonant sensor 10 including a remote sensor LC resonator 12 and sensor electronics 19. Sensor resonator 12 includes a sensor inductor Lsens 12L and a resonator capacitor Csens 12C. Remote sensor resonator 12 is driven at resonance by the sensor electronics 19 over a two-wire interconnect 14 (14SA/14B), interfaced at port 16 (terminals 16A/16B).

FIG. 1B provides an equivalent circuit representation of the two-wire interconnect 14, indicating wire inductances Lwire/2 14A/14B in series with the sensor inductor Lsens 12L, and in parallel with resonator capacitor Csens 12C, effectively forming a second series resonator. In addition to the driven resonance of the sensor resonator (Lsens/Csens), a second resonance mode current loop 20 is introduced by the interconnect inductances Lwire/2 14A/14B and resonator capacitor Csens 12C (the second series resonator). The second resonance mode can be especially challenging when the inductance Lwire of the long interconnect 14 is similar to the inductance of the sensor inductor Lsens, such that their resonance frequencies are close, such that the second resonance mode is challenging to distinguish/filter. The parasitic capacitor Cwire causes offset in the sensor resonator, but is typically not a significant problem.

For EMI, the two-wire conductor 14 introduces two types of parasitic antennas: (a) a loop antenna for the sensor loop current (the same current loop that causes the second resonance mode), and (b) a dipole antenna for the common mode voltage on the wire with respect to the circuit ground for the sensor electronics 19. Both can cause emission as well reception.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for remote sensing using sensor resonator with sensor inductor coupled to resonator capacitor over shielded transmission line.

According to aspects of the Disclosure, a remote inductive sensing system includes sensor resonator with a remote sense inductor coupled to a resonator capacitor over a shielded transmission line (T-line). The T-line includes a signal line and a shield return line: the sense inductor is connected at a T-line sensing end between the signal line and the shield return line, and the resonator capacitor is connected at a T-line terminal end to at least the signal line. An inductance-to-data converter (IDC) is connected at the T-line terminal end to the signal line and the shield return line. In operation, the IDC can drive oscillation signals over the signal line to the sensor resonator to sustain a resonance state, the sense inductor projecting a magnetic sensing field, and can convert changes in the oscillation drive signals, representing changes in resonance state resulting from a sensed condition, into sensor data corresponding to the sensed condition.

According to other aspects of the Disclosure, the IDC can be implemented with an operational transconductance amplifier including an output coupled to the signal line, and including a noninverting input coupled to the signal line to provide a positive feedback path from the sensor resonator, and an inverting input coupled to the shield return line, and to a voltage reference Vcm to set the shield return line to a common mode voltage Vcm. A low pass filter can be included in the positive feedback path to filter a second resonance frequency mode of the sensor resonator.

Other aspects and features of the invention claimed in this Patent Document will be apparent to those skilled in the art from the following Disclosure.

BRIEF DESCRIPTION OF THE DRAWINGS

FIGS. 3A and 3B are example impedance and phase plots for an inductive resonant sensor (such as in FIGS. 1/2) with two-wire interconnect to a remote sensor LC resonator, with the resonator capacitor on the sense inductor side of the interconnect, including showing (FIG. 3B) a relatively narrow frequency separation between resonator resonance frequencies [12A] at around 30 MHz, and respective second resonance modes [20A] at around 70 MHz.

FIGS. 4A and 4B are example impedance and phase plots for a remote inductive resonant sensor according to this Disclosure, using a sensor LC resonator with a remote sense inductor coupled to a resonator capacitor through a shielded transmission line, with the resonator capacitor on the IDC side of the shielded transmission line, including showing (FIG. 4B) a significantly increased frequency separation between resonator resonance frequencies [112A] at around 27 MHz and respective second resonance modes [120A] at around 250 MHz.

DETAILED DESCRIPTION

This Description and the Drawings constitute a Disclosure for remote inductive sensing using a sensor LC resonator with a remote sensor inductor coupled to a resonator capacitor over shielded transmission line, with the resonator capacitor located on the sensor electronics side of the transmission line, including describing example embodiments, and illustrating various technical features and advantages.

This Patent Disclosure uses the following nomenclature: "shielded transmission line" or "shielded cable" means an interconnect line with an inner signal line conductor and an outer shield conductor connected as a return line; and "inductance-to-data converter" means sensor/readout circuitry/electronics, including integrated circuitry, operable with a sensor resonator for inductive resonant sensing as described in this Disclosure.

In brief overview, a remote inductive sensing system includes sensor resonator with a remote sense inductor coupled to a resonator capacitor over a shielded transmission line (T-line). The T-line includes a signal line and a shield return line: the sense inductor is connected at a T-line sensing end between the signal line and the shield return line, and the resonator capacitor is connected at a T-line terminal end to at least the signal line. An inductance-to-data converter (IDC) is connected at the T-line terminal end to the signal line and the shield return line. In operation, the IDC drives oscillation signals over the signal line to the sensor resonator to sustain a resonance state, the sense inductor projecting a magnetic sensing field, and converts changes in the oscillation drive signals, representing changes in resonance state resulting from a sensed condition, into sensor data corresponding to the sensed condition. The IDC can be implemented with an operational transconductance amplifier including an output coupled to the signal line, and including a noninverting input coupled to the signal line to provide a positive feedback path from the sensor resonator, and an inverting input coupled to the shield return line, and to a voltage reference Vcm to set the shield return line to a common mode voltage Vcm. A low pass filter can be included in the positive feedback path to filter a second resonance frequency mode of the sensor resonator.

Figure 2:
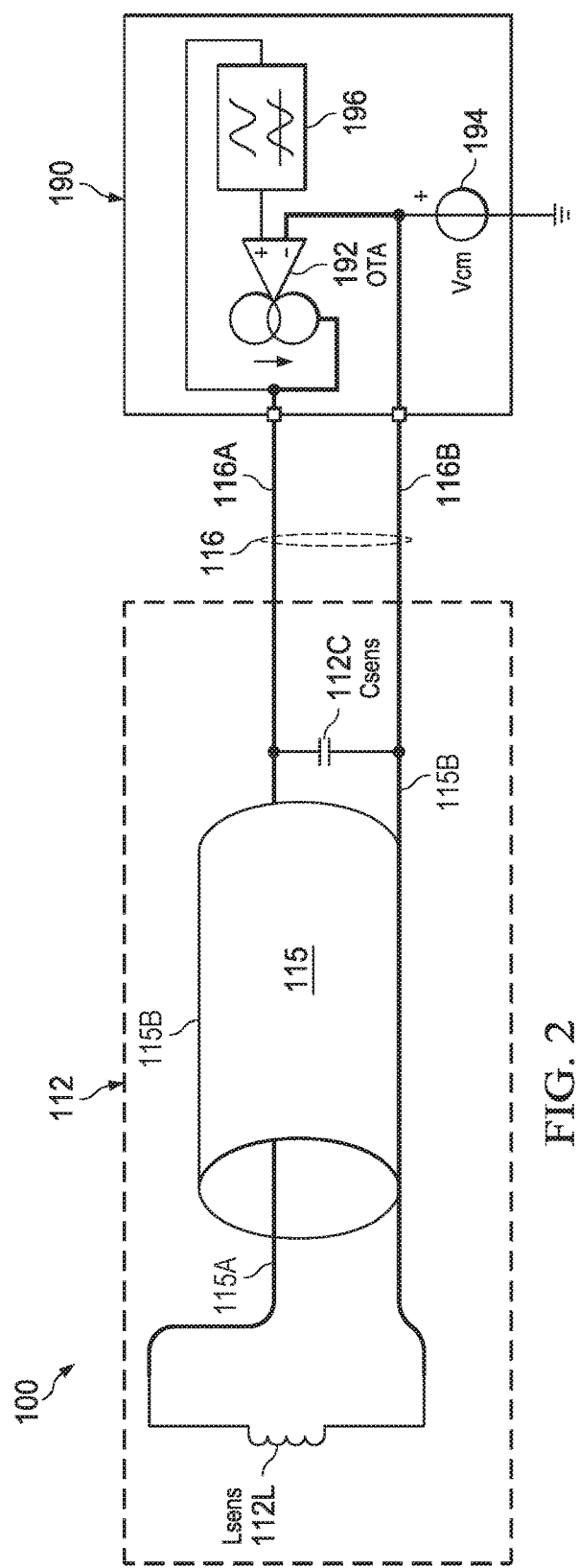
FIG. 2 illustrates an example embodiment of a remote inductive resonant sensor according to this Disclosure using a sensor LC resonator [112] coupled to an inductance-to-data converter (IDC) [190], the sensor resonator including a remote sensor inductor [Lsens 112L] located at a remote sensing site, and a resonator capacitor [Csens 112C] located near the IDC [IDC 190], the remote sensor inductor coupled to the resonator capacitor through a shielded transmission line [115], with a signal line [115A] and shield return line [115B], so that the resonator capacitor is located at the IDC side of the shielded transmission line.

FIG. 2 illustrates an example embodiment of a remote inductive resonant sensor 100 according to this Disclosure. Inductive resonant sensor 100 includes a sensor LC resonator 112 coupled to an inductance-to-data converter (IDC) 190 through an I/O port 116 (terminals 116A/116B). IDC 190 can include multiple I/O ports 116 for multi-channel operation with multiple sensor resonators.

Sensor resonator 112 includes a remote sensor inductor Lsens 112L and a resonator capacitor Csens 112C. Sensor inductor Lsens 112 is located at a sensing site remote from IDC 190.

Remote sensor inductor Lsens 112L is coupled to a resonator capacitor Csens 112C through a shielded (low impedance) transmission line (T-line) 115, with a signal line conductor 115A and shield conductor 115B connected as a return line. Sense inductor 112L is connected at a T-line sensing end between the signal line and the shield return line, and the resonator capacitor 112C is connected at a T-line terminal end between the signal line and the shield return line.

IDC 190 is coupled to the terminal end of T-line 115, through I/O port 116, with terminal 116A connected to signal line 115A, and terminal 116B connected to the shield return line 115B. That is, resonator capacitor Csens 112C is located at the IDC side of T-line 115.

IDC 190 operates as a non-balanced single sided oscillator driving a resonator oscillation signal through terminal 116A over signal line 115A to sensor resonator 112, including remote sense inductor 112L. Shield return line 115B is the return line (no signal) through terminal 116B, and is set by IDC 190 to a fixed common mode voltage level (Vcm).

Locating resonator capacitor Csens 112C at the IDC side of the T-line 115 increases frequency separation between the sensor resonator resonance frequency and the second resonance mode (transmission line self-resonance). This frequency separation effect is illustrated in FIGS. 4A/4B, in comparison to FIGS. 3A/3B.

IDC 190 is functionally illustrated as an OTA (operational transconductance amplifier) 192, operating as a non-balanced single sided oscillator. OTA 192 outputs current drive (oscillation signal) through terminal 116A over signal line 115A to the sensor resonator 112 to sustain a resonance state. The OTA noninverting input is connected for positive feedback from the sensor resonator (signal line 115A through terminal 116A). The OTA inverting input is coupled to the shield return line 115B through terminal 116B, set to a DC common mode voltage by a voltage reference Vcm 194.

OTA 192 drives sensor resonator 112 at sustained resonance, with remote sense inductor Lsens 112L projecting a magnetic sensing field for sensing an event/condition (such as proximity or position of a conductive target).

Sensor response to a sensed condition corresponds to changes in resonance state of the driven sensor resonator 112, determined based on changes in the OTA oscillator drive signals required to sustain resonance, as reflected in, for example, changes sensor inductance (sensor inductor Lsens), or changes in sensor resonator loss factor.

IDC 190 converts changes in the OTA oscillation drive signals, representing changes in resonance state resulting from the sensed condition, into sensor data corresponding to the sensed condition.

A filter 196 can be inserted in the positive feedback path to filter the second resonance mode of the sensor resonator 112, as well as to enhance the EMI immunity of the resonator.

Shield return line 115B effectively suppresses EMI reception and emission from the sensor resonator loop current over signal line 115A, while the fixed common mode level on shield 115B suppresses common mode radiation. In addition, shield 115B reduces sensitivity to parasitic capacitance between the wire and the environment.

Shielded transmission line 115 can be a transmission line with low characteristic impedance. Series inductance introduced by the transmission line equals: L_(t–line)=Z_O √εr/C_O len where $Z_O$=Characteristic impedance of the transmission line, $\varepsilon_r$=effective relative permittivity of substrate of the transmission line, $C_O$=speed of light, len=length of transmission line. This series inductance should be small compared to the sensor inductance Lsens, in order to reduce the loss of dynamic range. Hence, it's characteristic impedance should be low: Z_O<Lsense/(√εr/C_O len).

Figure 1A:
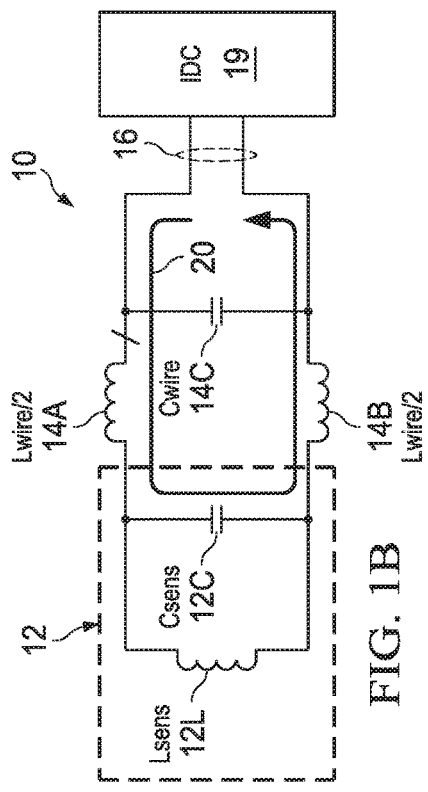
FIG. 1A illustrates remote inductive resonant sensing with an inductive resonant sensor [10] including a remote sensor LC resonator [12], with a sensor inductor [Lsens 12L] and a resonator capacitor [Csens 12C], coupled to sensor electronics [IDC 19] through a two-wire interconnect [14].
Figure 1B:
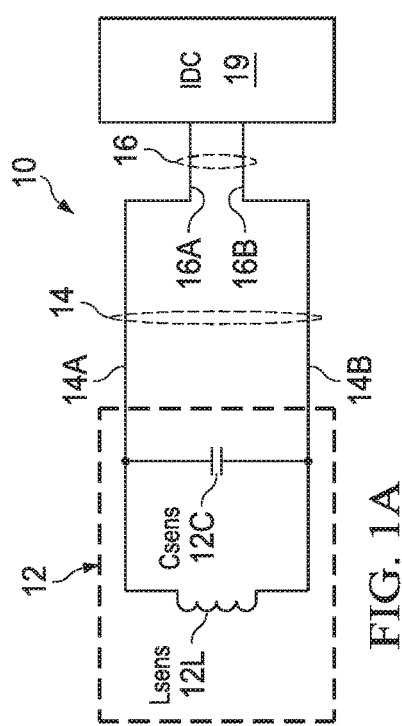
FIG. 1B provides an equivalent circuit representation of the two-wire interconnect [14], indicating wire inductances Lwire/2 [14A/14B], and illustrates a second resonance mode current loop [20] through the two-wire interconnect inductances Lwire/2 and the resonator capacitor [Csens 12C].
Figure 3B:
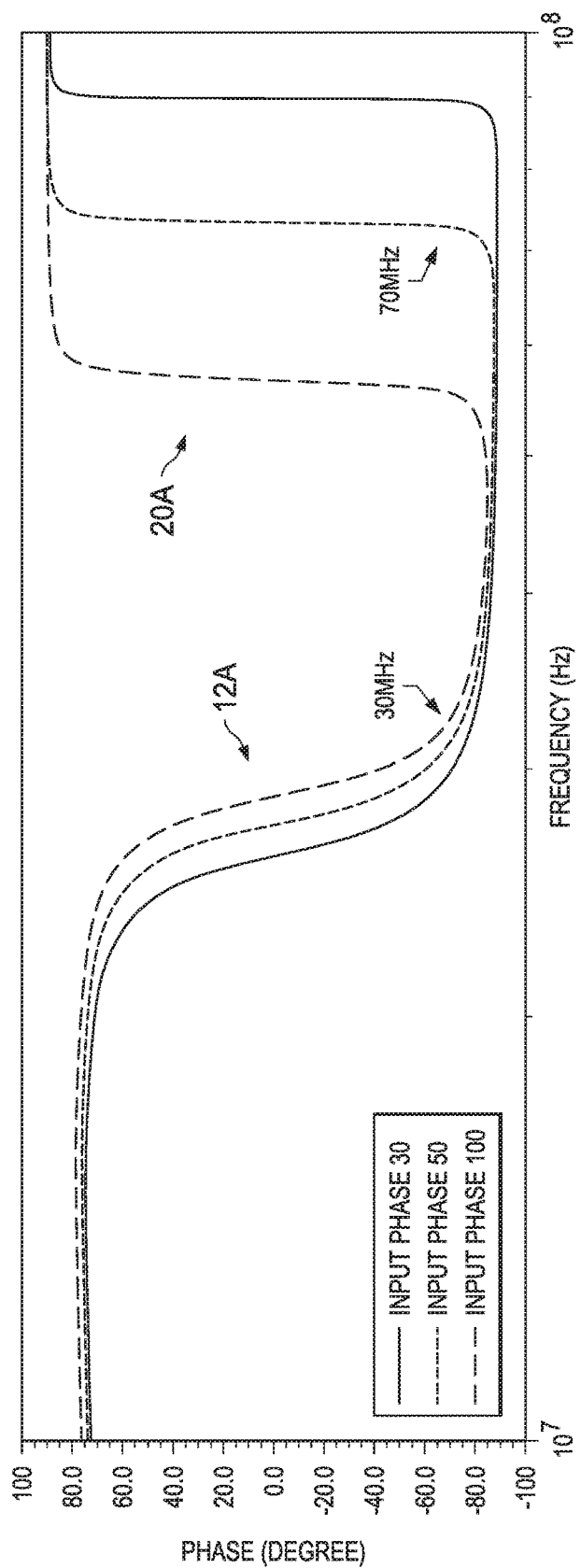

FIGS. 3A and 3B are example impedance and phase plots for an inductive resonant sensor such as in FIGS. 1/2, with a two-wire interconnect to a remote sensor LC resonator with the resonator capacitor on the sense inductor side of the interconnect. In particular, the FIG. 3B phase plots show a relatively narrow frequency separation between the resonator resonance frequencies 12A at around 30 MHz, and the respective second resonance modes 20A at around 70 MHz.

Figure 4B:
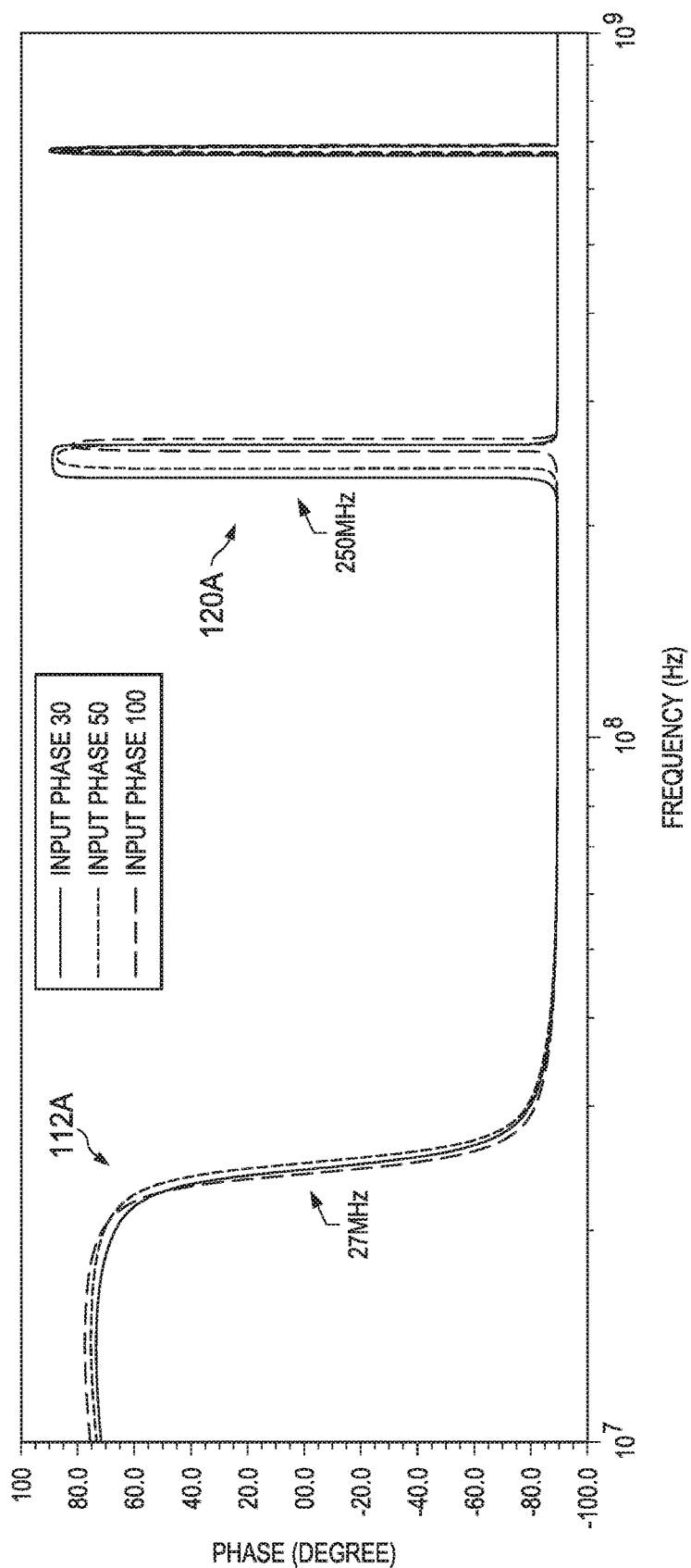

FIGS. 4A and 4B are example impedance and phase plots for a remote inductive resonant sensor according to this Disclosure, using a sensor LC resonator with a remote sense inductor coupled to a resonator capacitor through a shielded transmission line, with the resonator capacitor on the IDC side of the shielded transmission line.

Now the second resonance mode 120A is at a significantly higher frequency relative to the resonator resonance frequency 112A. In particular, the FIG. 4B phase plots show a significantly increased frequency separation between resonator resonance frequencies 112A at around 27 MHz and respective second resonance modes 120A at around 250 MHz. Since the resonator and second resonance modes are a decade apart in frequency, a relatively simple filter design can be used to eliminate the second resonance mode.

In summary, remote sensing using a sensor LC resonator with a remote sensor inductor coupled to a resonator capacitor over shielded transmission line moves the resonator capacitor away from the sensor inductor to the sensor electronics (IDC) side of the shielded transmission line, such that transmission line inductance is directly in series with the sensor inductor. Frequency separation is increased between sensor resonator resonance frequency and the second resonance mode, without requiring higher sensor inductance or resonator quality factor, enabling the use of compact sensor inductors at larger distances from the sensor electronics (IDC), and facilitating the use of simple filtering to eliminate the self-resonance of the transmission line.

The Disclosure provided by this Description and the Figures sets forth example embodiments and applications illustrating aspects and features of the invention, and does not limit the scope of the invention, which is defined by the claims. Known circuits, connections, functions and operations are not described in detail to avoid obscuring the principles and features of the invention. These example embodiments and applications, can be used by ordinarily skilled artisans as a basis for modifications, substitutions and alternatives to construct other embodiments, including adaptations for other applications.

The invention claimed is:

1. A system for inductive resonant sensing, comprising:
   a sensor resonator including a sense inductor and a resonator capacitor;
   a shielded transmission line with a signal line conductor and a shield return line conductor, the shielded transmission line having a sensing end and a terminal end, the sense inductor connected at the sensing end between the signal line conductor and the shield return line conductor, and
   the resonator capacitor connected at the terminal end to at least the signal line conductor; and
   an inductance-to-data converter (IDC) including first and second terminals connected at the terminal end of the shielded transmission line respectively to the signal line conductor and the shield return line conductor, the IDC including:
      an operational transconductance amplifier including an output coupled to the first terminal, and including
         a noninverting input coupled to the first terminal to provide a positive feedback path from the sensor resonator, and
         an inverting input coupled to the second terminal, and to a voltage reference Vcm.

2. The system of claim 1, wherein the IDC is operable:
   to drive an oscillation signal to the sensor resonator through the first terminal to the signal line conductor to sustain a resonance state, the sense inductor projecting a magnetic sensing field;
   to determine changes in the oscillation drive signal, representing changes in the resonance state resulting from a sensed condition; and
   to convert the determined changes in the oscillation drive signal to sensor data corresponding to the sensed condition.

3. The system of claim 1 wherein the IDC is operable to set the shield return line conductor to a common mode voltage Vcm.

4. The system of claim 1, further comprising:
   a low pass filter included in the positive feedback path to filter a second resonance frequency mode of the sensor resonator.

5. An inductance-to-data converter (IDC) circuit operable with a sensor resonator for inductive resonant sensing, the sensor resonator including a remote sense inductor and a resonator capacitor, and including a shielded transmission line with a signal line conductor and a shield return line conductor, the shielded transmission line having a sensing end and a terminal end, the sense inductor connected at the sensing end between the signal line conductor and the shield return line conductor, and the resonator capacitor connected at the terminal end to at least the signal line conductor, the IDC circuit comprising:
   first and second terminals connectable to the sensor resonator at the terminal end of the shielded transmission line, respectively to the signal line conductor and the shield return line conductor;
   an operational transconductance amplifier including an output coupled to the first terminal, and including
      a noninverting input coupled to the first terminal to provide a positive feedback path from the sensor resonator, and
      an inverting input coupled to the second terminal, and to a voltage reference Vcm;
   the operation transconductance amplifier operable:
      to drive an oscillation signal out through the first terminal for input to the sensor resonator over the signal line conductor, to sustain a resonance state, with the sense inductor projecting a magnetic sensing field; and
      to determine changes in the oscillation drive signal, representing changes in the resonance state resulting from a sensed condition, and to convert the determined changes in the oscillation drive signal to sensor data corresponding to the sensed condition.

6. The circuit of claim 5, further comprising:
a low pass filter included in the positive feedback path to filter a second resonance frequency mode of the sensor resonator.

7. The circuit of claim 5 further comprising voltage reference circuitry to set the shield return line conductor to a common mode voltage Vcm.

8. A method suitable for inductive resonant sensing, comprising:
configuring a sensor resonator with a sense inductor coupled to a resonator capacitor through a shielded transmission line with a signal line conductor and a shield return line conductor, the shielded transmission line having a sensing end and a terminal end, the sense inductor connected at the sensing end between the signal line conductor and the shield return line conductor, and the resonator capacitor connected at the terminal end to at least the signal line conductor;
configuring transconductance amplifier with an output coupled to the signal line conductor, and with
a noninverting input coupled to the signal line conductor to provide a positive feedback path from the sensor resonator, and
an inverting input coupled to the shield return line conductor, and to a voltage reference Vcm; and
with the transconductance amplifier;
driving an oscillation signal to the sensor resonator through the first terminal to the signal line conductor to sustain a resonance state, the sense inductor projecting a magnetic sensing field, and
determining changes in the oscillation drive signal, representing changes in the resonance state resulting from a sensed condition sensed; and
converting the determined changes in the oscillation signal to sensor data corresponding to the sensed condition.

9. The method of claim 8, further comprising:
setting the shield return line conductor to a common mode voltage Vcm.

10. The method of claim 8, further comprising:
a low pass filter included in the positive feedback path to filter a second resonance frequency mode of the sensor resonator.

* * * * *